US008319878B2

(12) United States Patent
Terada et al.

(10) Patent No.: US 8,319,878 B2
(45) Date of Patent: Nov. 27, 2012

(54) SOLID-STATE IMAGING DEVICE AND ITS PRODUCTION METHOD

(75) Inventors: Takashi Terada, Kumamoto (JP); Keisuke Hatano, Kanagawa (JP)

(73) Assignee: Sony Corporation, Tokyo (JP)

(*) Notice: Subject to any disclaimer, the term of this patent is extended or adjusted under 35 U.S.C. 154(b) by 147 days.

(21) Appl. No.: 12/723,086

(22) Filed: Mar. 12, 2010

(65) Prior Publication Data
US 2010/0271527 A1    Oct. 28, 2010

(30) Foreign Application Priority Data
Apr. 23, 2009    (JP) ................. 2009-104676

(51) Int. Cl.
*H04N 5/335*    (2011.01)
*H01L 21/339*    (2006.01)
*H01L 27/148*    (2006.01)

(52) U.S. Cl. ........ 348/311; 348/322; 438/144; 257/215; 257/232; 257/231; 257/225

(58) Field of Classification Search .......... 348/311–324; 257/213, 215–251; 438/142, 144–146
See application file for complete search history.

(56) References Cited

U.S. PATENT DOCUMENTS
5,397,730 A * 3/1995 Hojo et al. ............. 438/75
6,380,005 B1 * 4/2002 Nakashiba ............. 438/144

FOREIGN PATENT DOCUMENTS
JP    2007-12677    1/2007

* cited by examiner

*Primary Examiner* — Sinh Tran
*Assistant Examiner* — Mark Monk
(74) *Attorney, Agent, or Firm* — Robert J. Depke; Rockey, Depke & Lyons, LLC

(57) ABSTRACT

A solid-state imaging device of the type having photoelectric conversion elements formed in a matrix pattern on a semiconductor substrate, vertical transfer elements each of which reads signal charges from the photoelectric conversion elements arranged in the column direction and transfers the signal charges in the vertical direction, and a horizontal transfer element which transfers in the horizontal direction the signal charges sent from each of the vertical transfer elements, the horizontal transfer element includes: a charge transfer channel; a first transfer electrode; a second transfer electrode; and an interelectrode insulating film; with the first transfer electrode and the second transfer electrode being at the same potential.

7 Claims, 11 Drawing Sheets

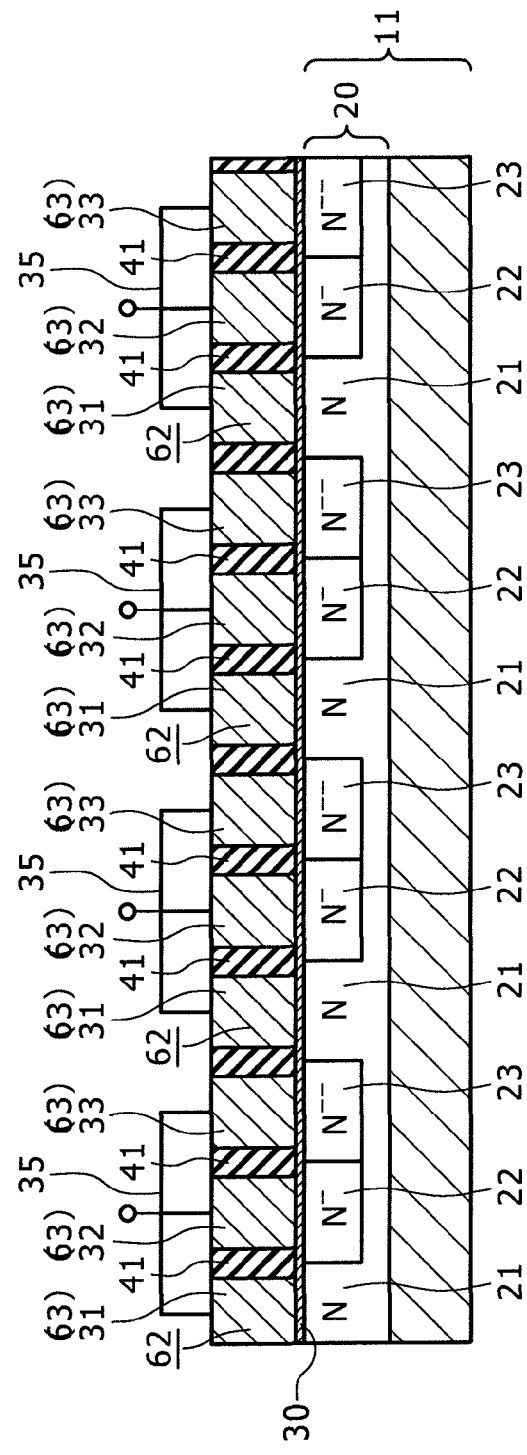

SOLID-STATE IMAGING DEVICE AND ITS PRODUCTION METHOD

The present application claims priority to Japanese Patent Application No. JP 2009-104676 filed in the Japan Patent Office on Apr. 23, 2009, the entire content of which is hereby incorporated by reference.

BACKGROUND OF THE INVENTION

1. Field of the Invention

The present invention relates to a solid-state imaging device and its production method.

2. Description of the Related Art

A solid-state imaging device of CCD (Charge Coupled Device) type has charge transfer electrodes to transfer signal charges from photoelectric conversion elements. These electrodes are juxtaposed to each other on a charge transfer channel formed on a semiconductor substrate so that they are driven sequentially.

An existing solid-state imaging device of CCD type is shown in FIG. 9 which is a schematic plan view.

It is composed of a semiconductor substrate 111 and photoelectric conversion elements 112, such as photodiodes, formed thereon which convert incident light into signal charges. Adjacent to these photoelectric conversion elements 112 is a vertical transfer element 113 which receives signal charges from the photoelectric conversion elements 112 and transfers them in the vertical direction. At the output end of each vertical transfer element 113 is the horizontal transfer element 114 which receives signal charges from each vertical transfer element 113 and transfers them in the horizontal direction. In addition, to the output end of the horizontal transfer element 114 is attached the output element 115 which converts signal charges transferred from the horizontal transfer element 114 into voltage for output.

A solid-state imaging device of CCD type 101 mentioned above needs improvement for a higher transfer rate. This need is achieved by reducing the resistance of the transfer electrodes 131 and 132 for the vertical transfer element 113 and the horizontal transfer element 114, respectively. Moreover, if the transfer electrodes 131 are made of an opaque metallic material, they have a decreased resistance and do not need to be covered with a shading film, which leads to an expansion of the photoelectric conversion area. As a result, the photoelectric conversion elements 112 can capture more light, which leads to an improved sensitivity.

The transfer electrodes of metallic material can be obtained in the following way. First, polysilicon electrodes are formed and an insulating material is applied onto them to fill their gaps and cover their tops. The insulating material covering the tops of the polysilicon electrodes is removed so that they are exposed, and then the exposed polysilicon electrodes are selectively removed. The hollows left after this step are filled with a metallic material. The excess portion of the metallic material that covers the insulating material is removed by chemical-mechanical polishing. The method of forming metallic electrodes as mentioned above is disclosed in Japanese Patent Laid-open No. 2007-12677.

The gap width between the transfer electrodes mentioned above is an important factor that determines the transfer efficiency of signal charges. It is known that the narrower the gap width, the better the transfer efficiency. Thus the horizontal transfer element has a very high density of electrodes, and this results in a large difference in pattern areal ratio between the imaging region and the transfer element.

The trend in the field of CCD is toward replacement of existing polysilicon with metal, such as tungsten, as a material of transfer electrodes (or toward the use of metal electrodes) for improvement in signal transfer rate and sensitivity, as mentioned above. The disadvantage of metal electrodes is that there is a difference in areal ratio between the transfer electrodes 131 of the vertical transfer elements 113 (which are arranged in the pixel region) and the transfer electrodes 132 of the horizontal transfer element 114 (which is arranged in the periphery of the pixel region), as shown in FIG. 10A. Incidentally, the term "areal ratio" represents the ratio (in %) of the area of the electrode that accounts for in one pitch of the transfer electrodes 131 of the vertical transfer elements 113 or the transfer electrodes 132 of the horizontal transfer element 114.

The areal ratio of the pattern affects the polishing characteristics when an excess portion of the metallic material 151 is removed from the insulating material 141 by chemical-mechanical polishing as shown in FIG. 10B. The result is erosion that occurs on the surface of the transfer electrode 132 which has a large areal ratio, as shown in FIG. 10C. This erosion results in a step which is larger in the surface of the transfer electrode 132 of the horizontal transfer element than in the surface of the transfer electrode 131 of the vertical transfer element.

SUMMARY OF THE INVENTION

It is desirable to address the problem involved in the existing technology that causes erosion (leading to a large step) to occur in the surface of the metal electrode when the transfer electrodes of the horizontal transfer element are formed from metal in the imaging device of CCD type.

It is still desirable to provide a solid-state imaging device and its production method, the former is that the areal ratio of the transfer electrodes of the horizontal transfer element is reduced or brought near to the areal ratio of the transfer electrodes of the vertical transfer element, so that the occurrence of erosion is suppressed.

The solid-state imaging device according to the present embodiment is of the type having photoelectric conversion elements formed in a matrix pattern on a semiconductor substrate, vertical transfer elements each of which reads signal charges from the photoelectric conversion elements arranged in the column direction and transfers the signal charges in the vertical direction, and a horizontal transfer element which transfers in the horizontal direction the signal charges sent from each of the vertical transfer element, the horizontal transfer element includes a charge transfer channel formed on the semiconductor substrate which is composed of a first charge transfer channel and a second charge transfer channel arranged alternately, the second charge transfer channel having a lower impurity concentration than the first charge transfer channel, a first transfer electrode formed on the first charge transfer channel, with a gate insulating film interposed between them, a second transfer electrode formed on the second charge transfer channel, with a gate insulating film interposed between them, and an interelectrode insulating film which is formed above the boundary between the first charge transfer channel and the second charge transfer channel and between the first transfer electrode and the second transfer electrode, with the first transfer electrode and the second transfer electrode being at the same potential.

The solid-state imaging device according to the present embodiment offers the advantage that the areal ratio of the transfer electrode of the horizontal transfer element is reduced because the transfer electrode, which used to be formed from a single electrode, is now composed of a first transfer electrode and a second transfer electrode which are separated from each other by an interelectrode insulating film and are at the same potential. The reduced areal ratio of the transfer electrode of the horizontal transfer element is close to that of the transfer electrode of the vertical transfer element. This in turn reduces erosion that occurs when the transfer electrode is formed by chemical-mechanical polishing.

In addition, the first transfer electrode and the second transfer electrode, which are separated from each other by the interelectrode insulating film, function as a single transfer electrode because they are at the same potential.

According to the present embodiment, the solid-state imaging device is produced by the following method (the first production method). This method includes a step of forming on a semiconductor substrate a first charge transfer channel and a second charge transfer channel alternately, with the latter having a lower impurity concentration than the former, a step of forming a gate insulating film on the semiconductor substrate and forming a dummy electrode pattern on the first charge transfer channel and the second charge transfer channel, with the gate insulating film interposed between them, and with a gap being formed above the boundary between the first charge transfer channel and the second charge transfer channel, a step of filling the gap between the adjacent dummy electrode patterns with an interelectrode insulating film, a step of causing each of the dummy electrode patterns to expose its surface and then removing each of the dummy electrode patterns, thereby forming the electrode forming grooves, and a step of filling each of the electrode forming grooves with a conductive material, performing chemical-mechanical polishing to remove the excess portion of the conductive material on the interelectrode insulating film, thereby forming the first transfer electrode in the electrode forming groove on the first charge transfer channel and also forming the second transfer electrode in the electrode forming groove on the second charge transfer channel.

The first production method offers the advantage that the areal ratio of the transfer electrode of the horizontal transfer element is reduced because the transfer electrode, which used to be formed from a single electrode, is now composed of a first transfer electrode and a second transfer electrode which are separated from each other by an interelectrode insulating film. The reduced areal ratio of the transfer electrode of the horizontal transfer element is close to that of the transfer electrode of the vertical transfer element. This in turn reduces erosion that occurs when the transfer electrode is formed by chemical-mechanical polishing.

According to the present embodiment, the solid-state imaging device is produced by the following method (the second production method). This method includes a step of forming on a semiconductor substrate a first charge transfer channel, a second charge transfer channel, and a third charge transfer channel sequentially and repeatedly, with the second one having a lower impurity concentration than the first one and the third one having a lower impurity concentration than the second one, a step of forming a gate insulating film on the semiconductor substrate and forming a dummy electrode pattern on each of the first charge transfer channel, the second charge transfer channel, and the third charge transfer channel, with the gate insulating film interposed between them, and with a gap being formed above the boundary between the charge transfer channels, a step of filling the gap between the adjacent dummy electrode patterns with an interelectrode insulating film, a step of causing each of the dummy electrode patterns to expose its surface and then removing each of the dummy electrode patterns, thereby forming the electrode forming grooves, and a step of filling each of the electrode forming grooves with a conductive material, performing chemical-mechanical polishing to remove the excess portion of the conductive material on the interelectrode insulating film, thereby forming the first transfer electrode in the electrode forming groove on the first charge transfer channel, the second transfer electrode in the electrode forming groove on the second charge transfer channel, and the third transfer electrode in the electrode forming groove on the third charge transfer channel.

The second production method offers the advantage that the areal ratio of the transfer electrode of the horizontal transfer element is reduced because the transfer electrode, which used to be formed from a single electrode, is now composed of a first transfer electrode, a second transfer electrode, and a third transfer electrode, which are separated from one another by an interelectrode insulating film. The reduced areal ratio of the transfer electrode of the horizontal transfer element is close to that of the transfer electrode of the vertical transfer element. This in turn reduces erosion that occurs when the transfer electrode is formed by chemical-mechanical polishing.

The solid-state imaging device according to the present embodiment has the areal ratio of the transfer electrode of the horizontal transfer element which is close or equal to that of the transfer electrode of the vertical transfer element. This reduces erosion that occurs when the transfer electrode is formed by chemical-mechanical polishing, which in turn contributes to good flatness. Good flatness alleviates processing difficulties encountered when the photoelectric conversion elements are provided with a color filter layer and an on-chip lens thereon thereby permitting high-precision forming and leading to sensitivity improvement.

The first and second production methods according to the present embodiment brings the areal ratio of the transfer electrode of the horizontal transfer element close to that of the transfer electrode of the vertical transfer element. This reduces erosion that occurs when the transfer electrode is formed by chemical-mechanical polishing, which in turn contributes to good flatness within the chip. Good flatness increases the allowable margin in subsequent processes and alleviates processing difficulties and permits high-precision processing.

BRIEF DESCRIPTION OF THE DRAWINGS

FIGS. 7A and 7B are sectional views showing second example of the process for producing the solid-state imaging device according to the second embodiment of the present invention;

DETAILED DESCRIPTION OF THE PREFERRED EMBODIMENTS

The following is a description of the embodiments of the present invention.
First Embodiment
[Solid-state Imaging Device—A First Example of its Structure]

Figure 1A:
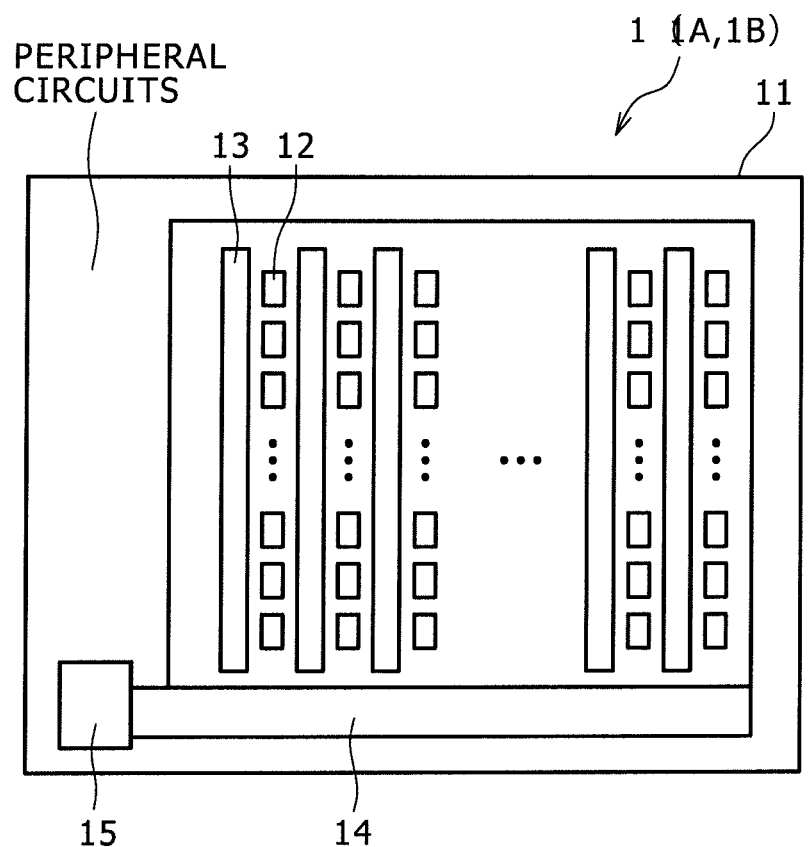
FIGS. 1A and 1B are a schematic plan view and a schematic sectional view showing respectively the configuration and the horizontal transfer element of the solid-state imaging device pertaining to the first example of the first embodiment of the present invention.
Figure 1B:
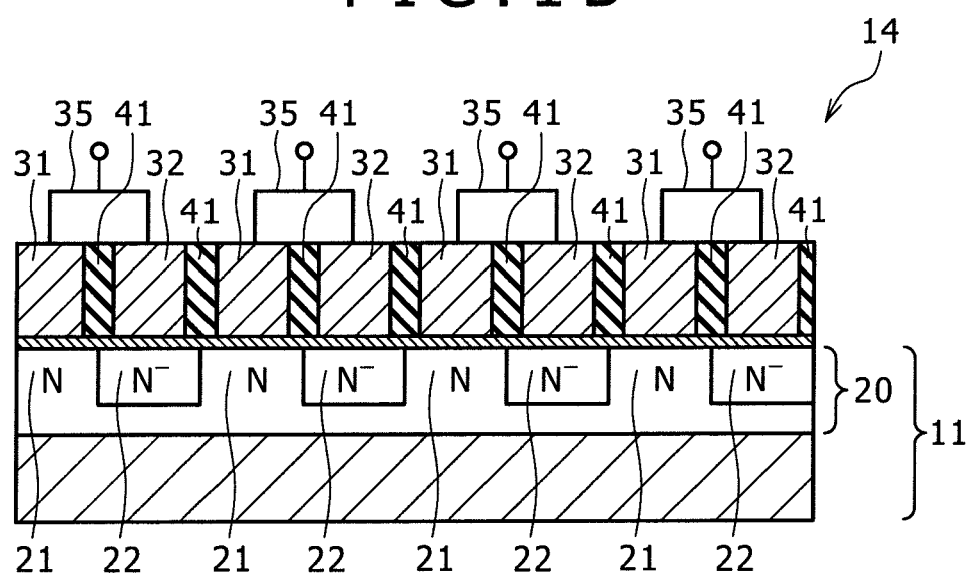

The solid-state imaging device according to the first embodiment of the present invention is constructed as shown in FIGS. 1A and 1B, part A of which is a schematic plan view and part B of which is a schematic sectional view of the horizontal transfer element. A first example of its structure is described below.

As shown in FIG. 1A, the solid-state imaging device 1 is composed of a semiconductor substrate 11 and various elements arranged thereon. The semiconductor substrate 11 may be a silicon substrate or a silicon layer of an SOI substrate. On the silicon substrate 11 are arranged photoelectric conversion elements 12 in a matrix pattern.

Along each column of the photoelectric conversion elements 12 is the vertical transfer element 13, which reads signal charges from them and transfers them in the vertical direction.

On the semiconductor substrate 11 is the horizontal transfer element 14, which transfers signal charges (sent from each of the vertical transfer elements 13) in the horizontal direction. At the output end of the horizontal transfer element 14 is the output element 15, which converts signal charges (sent from the horizontal transfer element 14) into voltage.

The horizontal transfer element 14 is constructed as follows.

As shown in FIG. 1B, the horizontal transfer element 14 has the charge transfer channel 20 formed on the semiconductor substrate 11. The charge transfer channel 20 is composed of the first charge transfer channel 21 and the second charge transfer channel 22, which are arranged alternately, with the latter having a lower impurity concentration than the former. For example, the first charge transfer channel 21 is formed from a layer containing N-type impurity diffused therein and the second charge transfer channel 22 is formed from a layer containing N-type impurity (in a lower concentration) diffused therein.

To be specific, the first transfer channel 21 is doped with arsenic (As) as an N-type impurity by ion implantation with an injection energy of 170 keV and at a dose of $2.94 \times 10^{12}$ ions/cm$^2$. The condition of ion implantation may be modified appropriately.

The second charge transfer channel 22 is formed by ion implantation with P-type impurity into the region where the first charge transfer channel 21 has been formed. To be specific, the P-type impurity is boron (B) and ion implantation is accomplished with an injection energy of 43 keV and at a dose of $7.5 \times 10^{11}$ ions/cm$^2$. The condition of ion implantation may be modified appropriately so long as the previously formed N-type region does not change into P-type.

On the first charge transfer channel 21 is formed the first transfer electrode 31, with the gate insulating film 30 interposed between them. Also, on the second charge transfer channel 22 is formed the second transfer electrode 32, with the gate insulating film 30 interposed between them.

The gate insulating film 30 may be formed from any ordinary material for the gate insulating film to be formed under the transfer electrode. An example of such a material is silicon oxide.

Both the first transfer electrode 31 and the second transfer electrode 32 are formed from metal, alloy, or metal compound.

The material for the metal electrode should be of low resistance and opacity. It was tungsten (W) in this embodiment. Other examples include aluminum (Al), ruthenium (Ru), iridium (Ir), cobalt (Co), nickel (Ni), chromium (Cr), rhodium (Rh), titanium (Ti), tantalum (Ta), hafnium (Hf), manganese (Mn), molybdenum (Mo), silver (Ag), palladium (Pd), vanadium (V), platinum (Pt), gold (Au), and copper (Cu). These metals may also be used in the form of nitride, silicide, or alloy, or in the form of laminate composed of two or more layers.

Above the boundary between the first charge transfer channel 21 and the second charge transfer channel 22, or between the first transfer electrode 31 and the second transfer electrode 32, is formed the interelectrode insulating film 41. This interelectrode insulating film 41 is formed from silicon oxide, for instance, which is used for ordinary interlayer insulating film. The first transfer electrode 31 and the second transfer electrode 32 are kept at the same potential. In other words, they are connected to each other by the wiring 35.

The foregoing is about the structure of the solid-state imaging device 1 or (1A).

The solid-state imaging device 1A mentioned above differs from the existing one in that the single transfer electrode formed on the first charge transfer channel 21 and the second charge transfer channel 22 is divided into two sections, one being the first transfer electrode 31 on the first charge transfer channel 21 and the other being the second transfer electrode 32 on the second charge transfer channel 22. Additional difference is that the interelectrode insulating film 41 is formed on the boundary between the first charge transfer channel 21 and the second charge transfer channel 22 and between the first transfer electrode 31 and the second charge transfer electrode 32. This structure reduces the areal ratio of the transfer electrode of the horizontal transfer element 14. Here, the term "areal ratio" represents the ratio (in %) of the area of the electrode that accounts for in one pitch of the transfer electrodes of the horizontal transfer elements 14 (or the vertical transfer element 13). Thus, the areal ratio of the transfer electrode of the horizontal transfer element 14 was reduced to 44%. This value is close or equal to the areal ratio (say, 49%) of the transfer electrode of the vertical transfer element 13.

Usually, the transfer electrode of the vertical transfer element 13 cannot be easily changed in size owing to restrictions inherent in design. So, it is necessary to reduce the areal ratio of the transfer electrode of the horizontal element 14 and bring it close to that of the transfer electrode of the vertical transfer element 13, so as to reduce erosion that occurs when the transfer electrode is formed by chemical-mechanical polishing. Reduced erosion contributes to in-chip flatness.

Figure 2A:
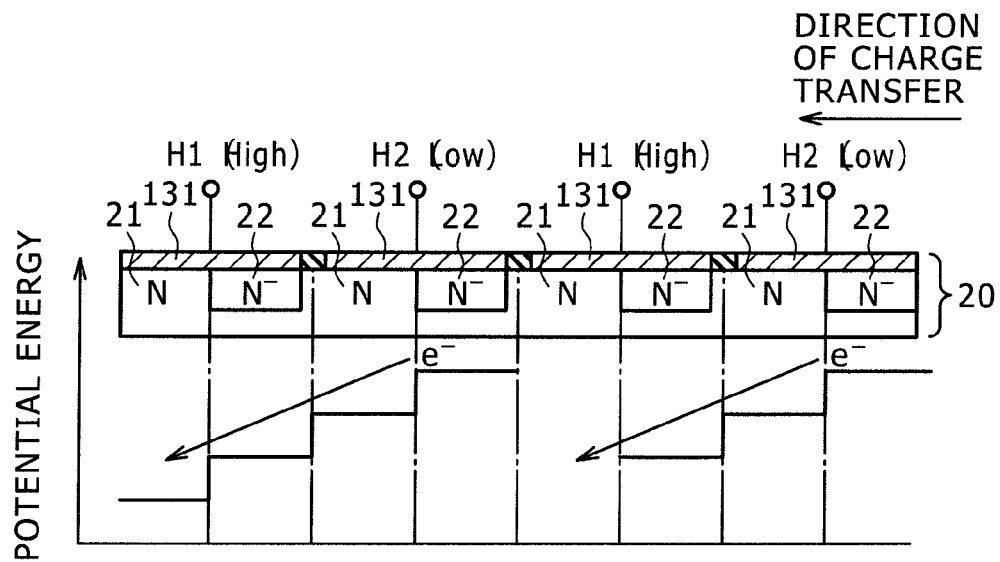
FIGS. 2A and 2B are potential diagrams illustrating charge transfer.
Figure 2B:
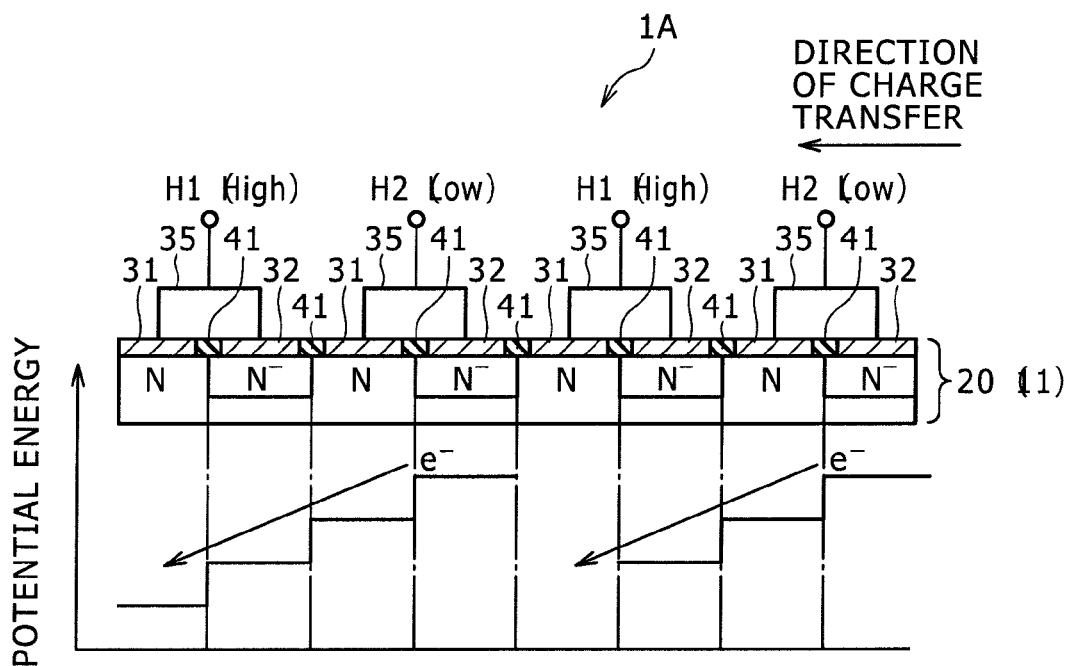

According to the existing structure shown in FIG. 2A, the charge transfer channel 20 of the horizontal transfer element 114 is composed of the first charge transfer channel 21 and the second charge transfer channel 22, which are arranged alternately, with the latter having a lower impurity concentration than the former. On the first and second charge transfer channels 21 and 22 adjoining to each other is formed one transfer electrode 131.

This structure can transfer signal charges (such as electrons) in the direction of arrow along the charge transfer channel 20 when a voltage of low level and a voltage of high level are applied sequentially to the transfer electrode 131 such that a stepwise potential is generated in the charge transfer channel 20.

By contrast, the solid-state imaging device 1A mentioned above has the first transfer electrode 31 and the second transfer electrode 32, which are formed separately and connected to each other by the wiring 35 so that their potential is equalized. Consequently, the first and second transfer electrodes 31 and 32, which are separated by the interelectrode insulating film 41, function as one transfer electrode.

In other words, application of an identical voltage to the first and second transfer electrodes 31 and 32 through the wiring 35 makes them function as one transfer electrode. Thus, by applying a voltage of low level and a voltage of high level sequentially to the transfer electrode composed of the first and second transfer electrodes 31 and 32, it is possible to generate a stepwise potential in the charge transfer channel 20, thereby transferring signal charges (such as electrons $e^-$) in the direction of arrow along the charge transfer channel 20.

The interelectrode insulating film 41 is formed between the first and second transfer electrodes 31 and 32 and is positioned above the boundary between the first and second charge transfer channels 21 and 22. This structure suppresses the potential strain that would otherwise occur between the first and second transfer electrodes 31 and 32. The result is smooth charge transfer.

Being formed from a metallic material, the first and second transfer electrodes 31 and 32 have a lower resistance than existing ones formed from polysilicon. Thus, they contribute to improved transfer rate and sensitivity.

The first and second transfer electrodes 31 and 32 which are separated by the interelectrode insulating film 41 have a smaller area that faces the semiconductor substrate 11, and this smaller area leads to a reduced capacity between the electrode and the substrate. The result is charge transfer with a smaller driving power.

Incidentally, the photoelectric conversion element 12 is covered with a color filter layer and an on-chip lens, which are not shown.

[Solid-state Imaging Device—A Second Example of its Structure]

Figure 3:
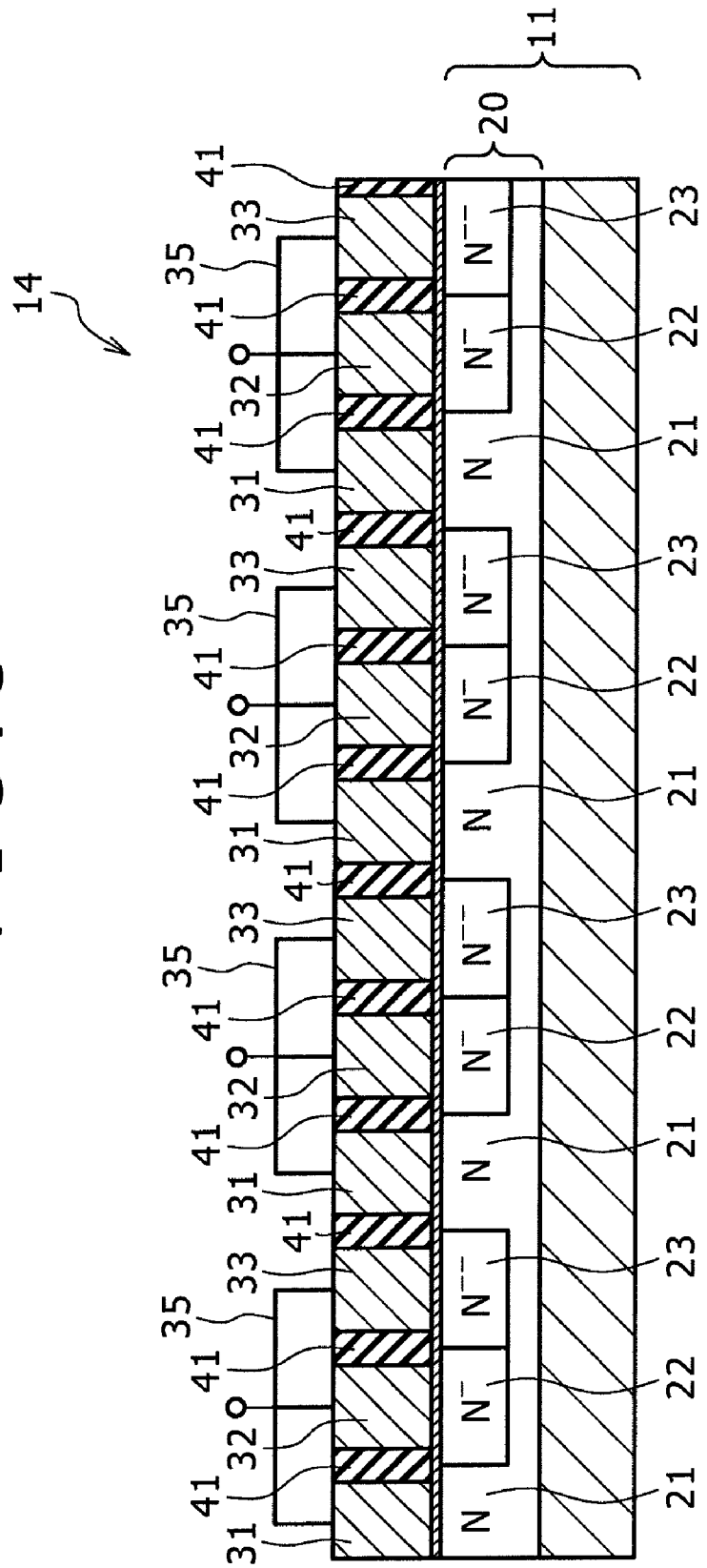
FIG. 3 is a schematic sectional view showing the configuration of the solid-state imaging device pertaining to the second example of the first embodiment of the present invention.
Figure 4:
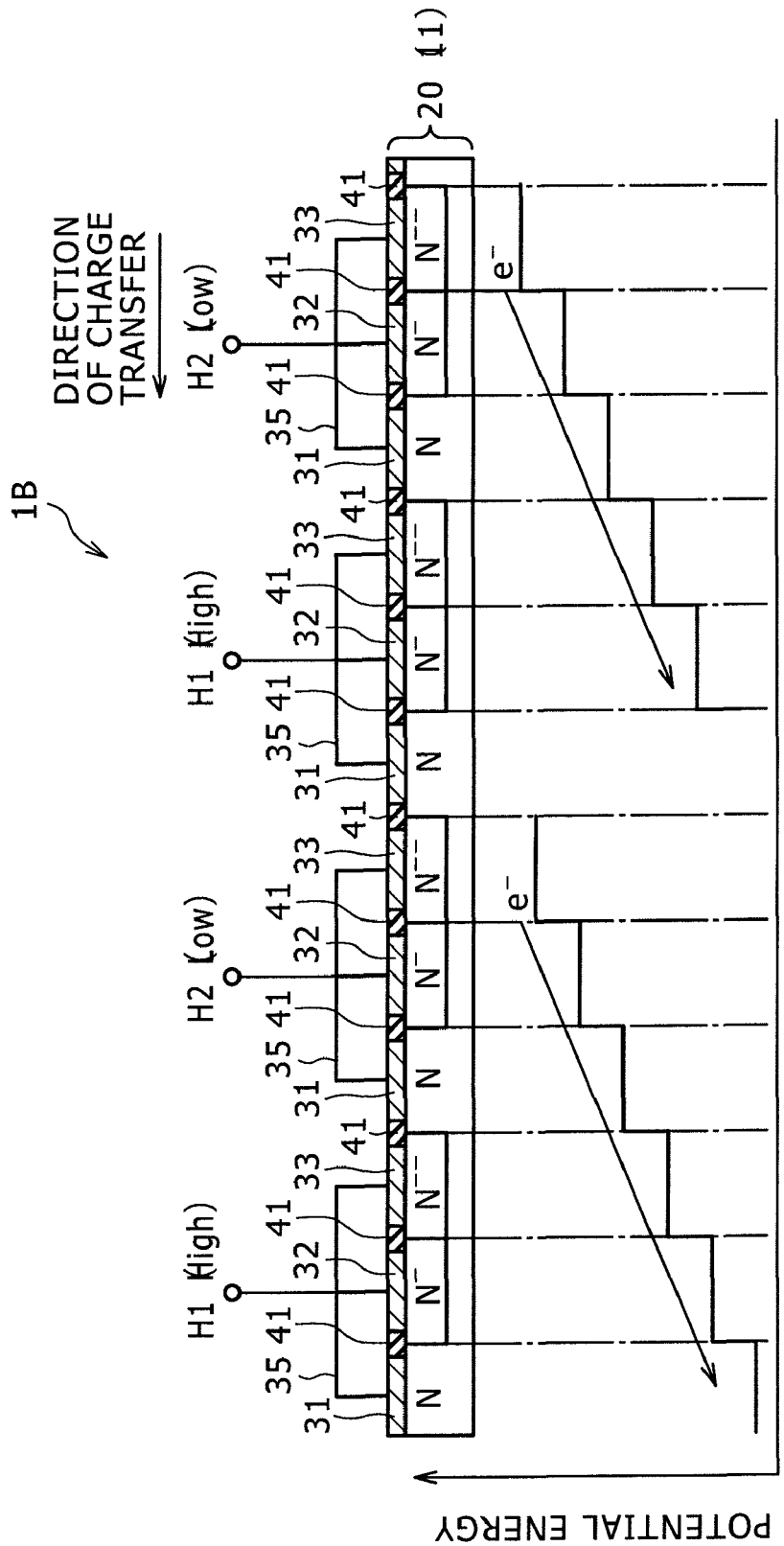
FIG. 4 is a potential diagram illustrating charge transfer.

The solid-state imaging device according to the first embodiment of the present invention is constructed as shown in FIG. 1A and FIG. 3, which is a schematic sectional view. A second example of its structure is described below.

As shown in FIG. 1A, the solid-state imaging device 1 is composed of a semiconductor substrate 11 and various elements arranged thereon. The semiconductor substrate 11 may be a silicon substrate or a silicon layer of an SOI substrate. On the silicon substrate 11 are arranged photoelectric conversion elements 12 in a matrix pattern.

Along each column of the photoelectric conversion elements 12 is the vertical transfer element 13, which reads signal charges from them and transfers them in the vertical direction.

On the semiconductor substrate 11 is the horizontal transfer element 14, which transfers signal charges (sent from each of the vertical transfer elements 13) in the horizontal direction. The horizontal transfer element 14 is constructed as follows.

As shown in FIG. 3, the horizontal transfer element 14 has the charge transfer channel 20 formed on the semiconductor substrate 11. The charge transfer channel 20 is composed of the first charge transfer channel 21, the second charge transfer channel 22, and the third charge transfer channel 23, which are arranged sequentially and repeatedly. The first charge transfer channel 21 is formed from a layer containing N-type impurity diffused therein. The second charge transfer channel 22 is formed from a layer containing a less amount of N-type impurity than the first charge transfer channel 21. The third charge transfer channel 23 is formed from a layer containing a less amount of N-type impurity than the second charge transfer channel 22.

To be specific, the first transfer channel 21 is doped with arsenic (As) as an N-type impurity by ion implantation with an injection energy of 170 keV and at a dose of $2.94 \times 10^{12}$ ions/cm$^2$ and then doped with boron (B) as a P-type impurity by ion implantation with an injection energy of 45 keV and at a dose of $2.1 \times 10^{11}$ ions/cm$^2$. The condition of ion implantation is a sheer example and may be modified appropriately.

Also, the second charge transfer channel 22 is formed by ion implantation with P-type impurity into the region where the first charge transfer channel 21 has been formed. To be specific, the P-type impurity is boron (B) and ion implantation is accomplished with an injection energy of 45 keV and at a dose of $4.2 \times 10^{11}$ ions/cm$^2$. The condition of ion implantation is a sheer example and may be modified appropriately so long as the previously formed N-type region does not change into P-type.

Further, the third charge transfer channel 23 is formed by ion implantation with P-type impurity into the region where the first charge transfer channel 21 has been formed. To be specific, the P-type impurity is boron (B) and ion implantation is accomplished with an injection energy of 43 keV and at a dose of $6.3 \times 10^{11}$ ions/cm$^2$. The condition of ion implantation is a sheer example and may be modified appropriately so long as the previously formed N-type region does not change into P-type.

On the first charge transfer channel 21 is formed the first transfer electrode 31, with the gate insulating film 30 interposed between them. Also, on the second charge transfer channel 22 is formed the second transfer electrode 32, with the gate insulating film 30 interposed between them. Further, on the third charge transfer channel 23 is formed the third transfer electrode 33, with the gate insulating film 30 interposed between them.

The gate insulating film 30 may be formed from any ordinary material for the gate insulating film to be formed under the transfer electrode. An example of such a material is silicon oxide. All of the first transfer electrode 31, the second transfer electrode 32, and the third transfer electrode 33 are formed from metal, alloy, or metal compound.

The material for the metal electrode should be of low resistance and opacity. It was tungsten (W) in this embodiment. Other examples include aluminum (Al), ruthenium (Ru), iridium (Ir), cobalt (Co), nickel (Ni), chromium (Cr), rhodium (Rh), titanium (Ti), tantalum (Ta), hafnium (Hf), manganese (Mn), molybdenum (Mo), silver (Ag), palladium (Pd), vanadium (V), platinum (Pt), gold (Au), and copper (Cu). These metals may also be used in the form of nitride, silicide, or alloy, or in the form of laminate composed of two or more layers.

The interelectrode insulating film 41 is formed above the boundaries between the first, second, third charge transfer channels 21, 22, and 23 and between the first, second, and third transfer electrodes 31, 32, and 33. The material for this interelectrode insulating film 41 is one, such as silicon oxide, which is used for ordinary interlayer insulating film. And the first, second, and third transfer electrodes 31, 32, and 33 are kept at an identical potential because they are connected to one another by the wiring 35.

The foregoing is about the structure of the solid-state imaging device 1 or (1B).

The solid-state imaging device 1B mentioned above differs from the existing one in that the single transfer electrode formed on the first, second, and third charge transfer channels 21, 22, and 23 is divided into three sections, which are the first, second, and third transfer electrodes 31, 32, and 33, respectively. Additional difference is that the interelectrode insulating film 41 is formed on the boundary between the first, second, and third charge transfer channels 21, 22, and 23 and also between the first, second, and third transfer electrodes 31, 32, and 33. This structure reduces the areal ratio of the transfer electrode of the horizontal transfer element 14. Thus, the areal ratio of the transfer electrode of the horizontal transfer element 14 was reduced and brought close or equal to the areal ratio (say, 49%) of the transfer electrode of the vertical transfer element 13.

Usually, the transfer electrode of the vertical transfer element 13 cannot be easily changed in size owing to restrictions inherent in design. So, it is necessary to reduce the areal ratio of the transfer electrode of the horizontal element 14 and bring it close to that of the transfer electrode of the vertical transfer element 13, so as to reduce erosion that occurs when the transfer electrode is formed by chemical-mechanical polishing. Reduced erosion contributes to in-chip flatness.

The solid-state imaging device 1B mentioned above has the first, second, and third transfer electrodes 31, 32, and 33, which are formed separately and connected to one another by the wiring 35 so that their potential is equalized. Consequently, the first, second, and third transfer electrodes 31, 32, and 33, which are separated by the interelectrode insulating film 41, function as one transfer electrode.

In other words, application of an identical voltage to the first, second, and third transfer electrodes 31, 32, and 33 through the wiring 35 makes them function as one transfer electrode. Thus, by applying a voltage of low level and a voltage of high level sequentially to the transfer electrode composed of the first, second, and third transfer electrodes 31, 32, and 33, it is possible to generate a stepwise potential in the charge transfer channel 20, thereby transferring signal charges (such as electrons) in the direction of arrow along the charge transfer channel 20.

The interelectrode insulating film 41 is formed between the first, second, and third transfer electrodes 31, 32, and 33 and is positioned above the boundary between the first, second, and third charge transfer channels 21, 22, and 23. This structure suppresses the potential strain that would otherwise occur between the first, second, and third transfer electrodes 31, 32, and 33. The result is smooth charge transfer.

Being formed from a metallic material, the first, second, and third transfer electrodes 31, 32, and 33 have a lower resistance than existing ones formed from polysilicon. Thus, they contribute to improved transfer rate and sensitivity.

The first, second, and third transfer electrodes 31, 32, and 33 which are separated by the interelectrode insulating film 41 have a smaller area that faces the semiconductor substrate 11, and this smaller area leads to a reduced capacity between the electrode and the substrate. The result is charge transfer with a smaller driving power.

Incidentally, the photoelectric conversion element 12 is covered with a color filter layer and an on-chip lens, which are not shown.

Figure 5:
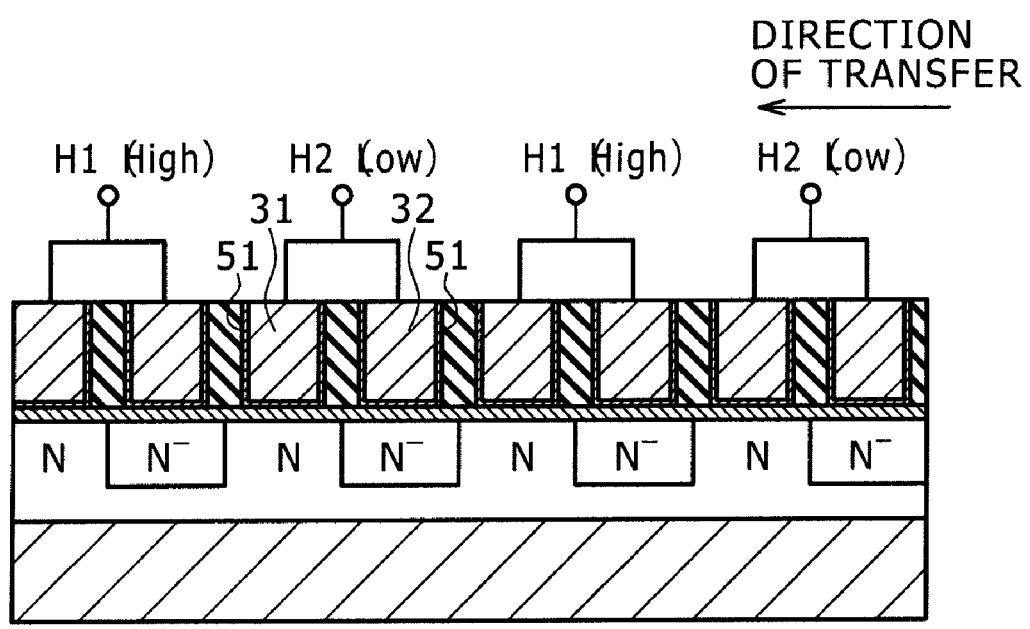
FIG. 5 is a schematic sectional view showing the configuration of another example of the solid-state imaging device according to the present embodiment.

In addition, the solid-state imaging device 1 mentioned above may be modifies such that each of the first, second, and the third transfer electrodes 31, 32, and 33 is surrounded by a barrier metal layer 51, as shown in FIG. 5. (The third transfer electrode 33 is not shown in FIG. 5.) This barrier metal layer 51 prevents the transfer electrode from its diffusing constituent metal (such as copper which easily oxidizes or easily diffuses into the insulating film) into the surrounding and also protects the metal from oxidation. This keeps resistance low.

Second Embodiment

[Solid-state Imaging Device—A First Example of its Production Method]

The solid-state imaging device according to the second embodiment of the present invention is produced by the method (as a first example) which will be described below with reference to FIGS. 6A to 6E. FIGS. 6A to 6E, which are sectional views, illustrate the method for producing the horizontal transfer element of the solid-state imaging device. Existing methods are used to produce other elements than the horizontal transfer element, such as photoelectric conversion element, horizontal transfer element, and peripheral circuits. The horizontal transfer element may be formed at the same time when the vertical transfer element is formed.

Figure 6A:
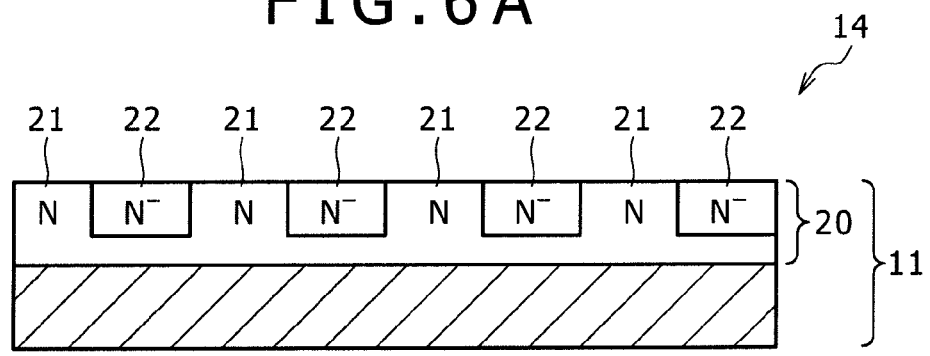
FIGS. 6A to 6E are sectional views showing first example of the process for producing the solid-state imaging device according to the second embodiment of the present invention.

In the first step shown in FIG. 6A, the semiconductor substrate 11 is processed such that the horizontal transfer element 14 is formed therein. The horizontal transfer element 14 is composed of the first charge transfer channel 21 and the second charge transfer channel 22, which are arranged alternately, with the latter containing a less amount of impurity than the former.

This is accomplished by covering the semiconductor substrate 11 with a resist mask (not shown) which has an opening in the area where the horizontal transfer element is to be formed and then performing ion implantation to form the first charge transfer channel 21. This ion implantation employs arsenic (As) as a dopant for N-type impurity, an injection energy of 170 keV, and a dose of $2.94 \times 10^{12}$ ions/cm$^2$. The condition of ion implantation is a sheer example and may be modified appropriately.

Then, the photoresist mask is removed. Another resist mask (not shown) is newly formed which has an opening on the area where the second transfer channel is to be formed. This resist mask is used to perform ion implantation to inject P-type impurity into the first charge transfer channel 21. In this way the second charge transfer channel 22 is formed. This ion implantation employs boron (B) as a dopant for P-type impurity, an injection energy of 43 keV, and a dose of $7.5 \times 10^{11}$ ions/cm$^2$. The condition of ion implantation is a sheer example and may be modified appropriately so long as the previously formed N-type region does not change into P-type.

In this way it is possible to establish a potential level along the charge transfer direction in the charge transfer channel 20.

Figure 6B:
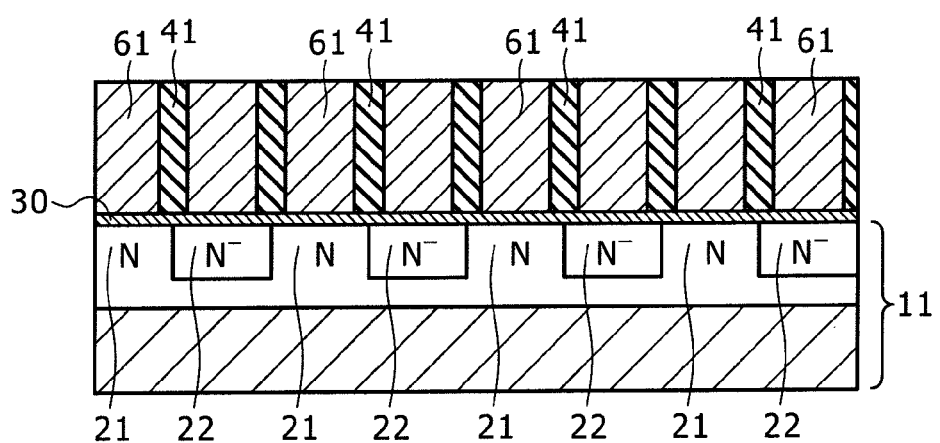

As shown in FIG. 6B, the gate insulating film 30 is formed on the semiconductor substrate 11 from silicon oxide or the like which is commonly used for the gate insulating film to be formed under the transfer electrode.

Then, the dummy electrode pattern 61 is formed above the first charge transfer channel 21 and the second charge transfer channel 22, with the gate insulating film 30 interposed between them, and between the first charge transfer channel 21 and the second charge transfer channel 22, with the gap interposed between them. This dummy electrode pattern 61 may be formed in the same way as the ordinary pattern is formed. For example, it is formed from a polysilicon film by lithography and etching (dry etching).

The gap between the adjacent dummy electrode patterns 61 is filled with the interelectrode insulating film 41. As the result of this step, the interelectrode insulating film 41 covers the dummy electrode patterns 61. Chemical-mechanical polishing is performed to cause the dummy electrode pattern 61 to expose its surface.

The dummy electrode patter 61 is removed (not shown) by wet etching (with ammonia etchant) or dry etching. Wet etching is desirable because of light damage to the substrate. If the step of removing the dummy electrode pattern 61 causes a damage to the underlying gate insulating film 30, it is possible to form the gate insulating film 30 again. What remains after the dummy electrode pattern 61 has been removed is the electrode forming groove 62. See FIG. 6C.

Figure 6C:
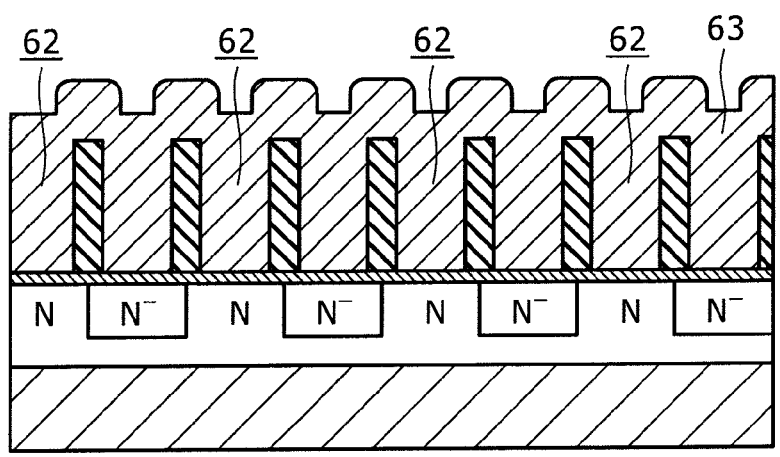

Each of the electrode forming grooves 62 is filled with the conductive material 63, as shown in FIG. 6C. This conductive material 63 should preferably be of low resistance and opacity. It was tungsten (W) in this embodiment. Other examples include aluminum (Al), ruthenium (Ru), iridium (Ir), cobalt (Co), nickel (Ni), chromium (Cr), rhodium (Rh), titanium (Ti), tantalum (Ta), hafnium (Hf), manganese (Mn), molybdenum (Mo), silver (Ag), palladium (Pd), vanadium (V), platinum (Pt), gold (Au), and copper (Cu). These metals may also be used in the form of nitride, silicide, or alloy, or in the form of laminate composed of two or more layers.

Incidentally, before being filled with the conductive material 63, the electrode forming groove 62 may have its inside lined with a barrier metal layer (not shown). This barrier metal layer prevents the conductive material 63 from diffusing into the surrounding or from being oxidized, even in the case where the conductive material 63 is formed from such metal as copper (Cu) which easily oxidizes or easily diffuses into the insulating film. This keeps resistance low.

Figure 6D:
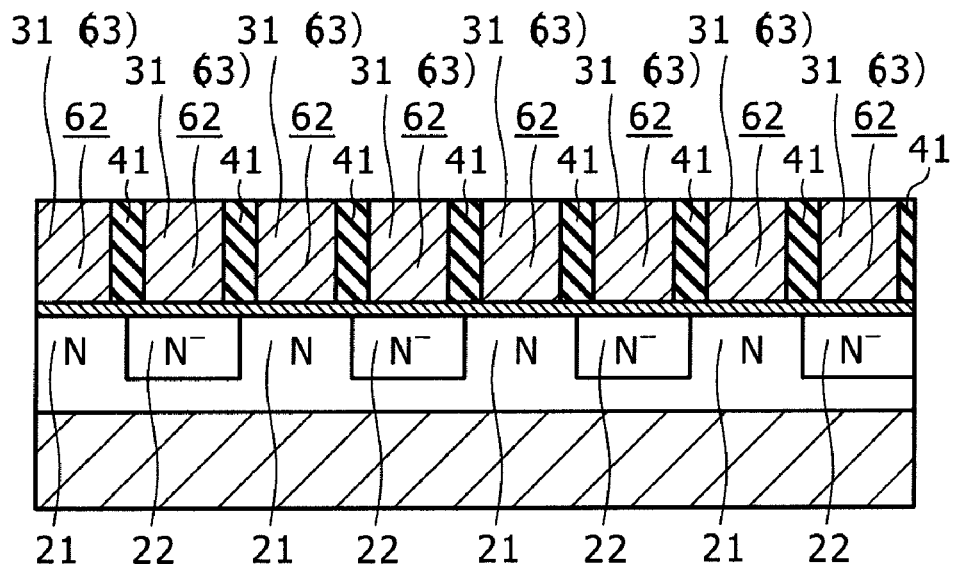

That part of the conductive material 63 that protrudes over the interelectrode insulating film 41 is removed by chemical-mechanical polishing, so that the transfer electrode is formed in the electrode forming groove 62, as shown in FIG. 6D. That is, the first transfer electrode 31 is formed in the electrode forming groove 62 on the first charge transfer channel 21, with the gate insulating film 30 interposed between them. At the same time, the second transfer electrode 32 is formed in the electrode forming groove 62 on the second charge transfer channel 22, with the gate insulating film 30 interposed between them.

Figure 6E:
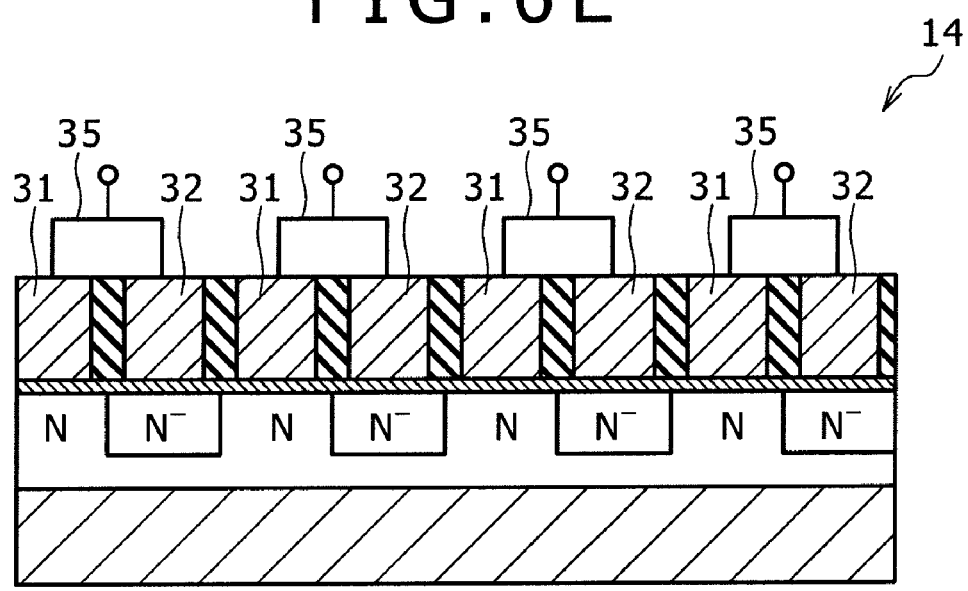

The first and second transfer electrodes 31 and 32 are connected to each other by the wiring 35, which is formed by the ordinary wiring forming technology, as shown in FIG. 6E.

In the solid-state imaging device produced by the foregoing method, the transfer electrode, which is a single electrode in the existing one, is composed of the first transfer electrode 31 and the second transfer electrode 32 which are separated by the interelectrode insulating film 41. This structure reduces the areal ratio of the transfer electrode of the horizontal transfer element 14. This in turn makes the areal ratio of the transfer electrode of the horizontal transfer element 14 close to the areal ratio of the transfer electrode of the vertical transfer element (not shown). Moreover, the foregoing production method reduces erosion that occurs when the transfer electrode is formed by chemical-mechanical polishing.

The first and second transfer electrodes 31 and 32, which are divided by the interelectrode insulating film 41, have the same potential because they are connected to each other by the wiring 35. Therefore, these separated two electrodes function as a single transfer electrode.

[Solid-state Imaging Device—A Second Example of its Production Method]

The solid-state imaging device according to the second embodiment of the present invention is produced by the method (as a second example) which will be described below with reference to FIGS. 7A and 7B.

On the semiconductor substrate 11 are sequentially formed the first, second, and third charge transfer channels 21, 22, 23, constituting the horizontal transfer element 14, as shown in FIG. 7A. These charge transfer channels gradually decrease in impurity concentration in going from the first to the third.

This structure can be obtained by covering the semiconductor substrate 11 with a resist mask (not shown) which has an opening in the area where the horizontal transfer element is to be formed and then performing ion implantation to form the first charge transfer channel 21. This ion implantation employs arsenic (As) as a dopant for N-type impurity, an injection energy of 170 keV, and a dose of $2.94 \times 10^{12}$ ions/$cm^2$. The condition of ion implantation is a sheer example and may be modified appropriately.

Then, the photoresist mask is removed. Another resist mask (not shown) is newly formed which has an opening on the area where the second transfer channel is to be formed. This resist mask is used to perform ion implantation to inject P-type impurity into the first charge transfer channel 21. In this way the second charge transfer channel 22 is formed. Thus, the second charge transfer channel 21 is doped with N-type impurity and P-type impurity.

This ion implantation employs boron (B) as a dopant for P-type impurity, an injection energy of 45 keV, and a dose of $4.2 \times 10^{11}$ ions/$cm^2$. The condition of ion implantation is a sheer example and may be modified appropriately so long as the previously formed N-type region does not change into P-type.

Then, the photoresist mask is removed. Another resist mask (not shown) is newly formed which has an opening on the area where the third transfer channel is to be formed. This resist mask is used to perform ion implantation to inject P-type impurity into the first charge transfer channel 21. In this way the third charge transfer channel 23 is formed. Thus, the third charge transfer channel 23 is doped with N-type impurity and P-type impurity.

This ion implantation employs boron (B) as a dopant for P-type impurity, an injection energy of 45 keV, and a dose of $6.3 \times 10^{11}$ ions/$cm^2$. The condition of ion implantation is a sheer example and may be modified appropriately so long as the previously formed N-type region does not change into P-type. Then, the photoresist mask is removed.

In this way it is possible to establish a potential level along the charge transfer direction in the charge transfer channel 20.

The procedure for production method explained above with reference to FIGS. 6B to 6E is repeated. That is, as shown in FIG. 7B, the gate insulating film 30 is formed on the semiconductor substrate 11 from silicon oxide or the like which is commonly used for the gate insulating film to be formed under the transfer electrode. It was silicon oxide in this embodiment.

Then, the dummy electrode pattern 61 is formed above the first, second, and third charge transfer channels 21, 22, and 23, with the gate insulating film 30 interposed between them, and between the first, second, and third charge transfer channels 21, 22, and 23, with the gap (above each of their boundaries) interposed between them. (See also FIG. 6B.) This dummy electrode pattern 61 may be formed in the same way as the ordinary pattern is formed. For example, it is formed from a polysilicon film by lithography and etching (dry etching).

The gap between the adjacent dummy electrode patterns 61 is filled with the interelectrode insulating film 41. As the result of this step, the interelectrode insulating film 41 covers the dummy electrode patterns 61. Chemical-mechanical polishing is performed to cause the dummy electrode pattern 61 to expose its surface.

The dummy electrode pattern 61 is removed by wet etching (with ammonia etchant) or dry etching. Wet etching is desirable because of light damage to the substrate. If the step of removing the dummy electrode pattern 61 causes a damage to the underlying gate insulating film 30, it is possible to form the gate insulating film 30 again. What remains after the dummy electrode pattern 61 has been removed is the electrode forming groove 62.

Each of the electrode forming grooves 62 is filled with the conductive material 63, as shown in FIG. 6C. This conductive material should preferably be of low resistance and opacity. It was tungsten (W) in this embodiment. Other examples include aluminum (Al), ruthenium (Ru), iridium (Ir), cobalt (Co), nickel (Ni), chromium (Cr), rhodium (Rh), titanium (Ti), tantalum (Ta), hafnium (Hf), manganese (Mn), molybdenum (Mo), silver (Ag), palladium (Pd), vanadium (V), platinum (Pt), gold (Au), and copper (Cu). These metals may also be used in the form of nitride, silicide, or alloy, or in the form of laminate composed of two or more layers.

Incidentally, before being filled with the conductive material 63, the electrode forming groove 62 may have its inside lined with a barrier metal layer (not shown). This barrier metal layer prevents the conductive material 63 from diffusing into the surrounding or from being oxidized, even in the case where the conductive material 63 is formed from such metal as copper (Cu) which easily oxidizes or easily diffuses into the insulating film. This keeps resistance low.

That part of the conductive material 63 that protrudes over the interelectrode insulating film 41 (not shown) is removed by chemical-mechanical polishing, so that the transfer electrode is formed in the electrode forming groove 62. That is, the first transfer electrode 31 is formed in the electrode forming groove 62 on the first charge transfer channel 21, with the gate insulating film 30 interposed between them. At the same time, the second transfer electrode 32 is formed in the electrode forming groove 62 on the second charge transfer channel 22, with the gate insulating film 30 interposed between them. Further, at the same time, the third transfer electrode 33 is formed in the electrode forming groove 62 on the third charge transfer channel 23, with the gate insulating film 30 interposed between them.

The first, second, and third transfer electrodes 31, 32, and 33 are connected to one another by the wiring 35, which is formed by the ordinary wiring forming technology.

In the solid-state imaging device produced by the foregoing method, the transfer electrode, which is a single electrode in the existing one, is composed of the first, second, and third transfer electrodes 31, 32, and 33 which are separated by the interelectrode insulating film 41. This structure reduces the areal ratio of the transfer electrode of the horizontal transfer element 14. This in turn makes the areal ratio of the transfer electrode of the horizontal transfer element 14 close to the areal ratio of the transfer electrode of the vertical transfer element (not shown). Moreover, the foregoing production method reduces erosion that occurs when the transfer electrode is formed by chemical-mechanical polishing.

The first, second, and third transfer electrodes 31, 32, and 33, which are divided by the interelectrode insulating film 41, have the same potential because they are connected to one another by the wiring 35. Therefore, these separated three electrodes function as a single transfer electrode.

[Application to Image Acquisition Instruments]

Figure 8:
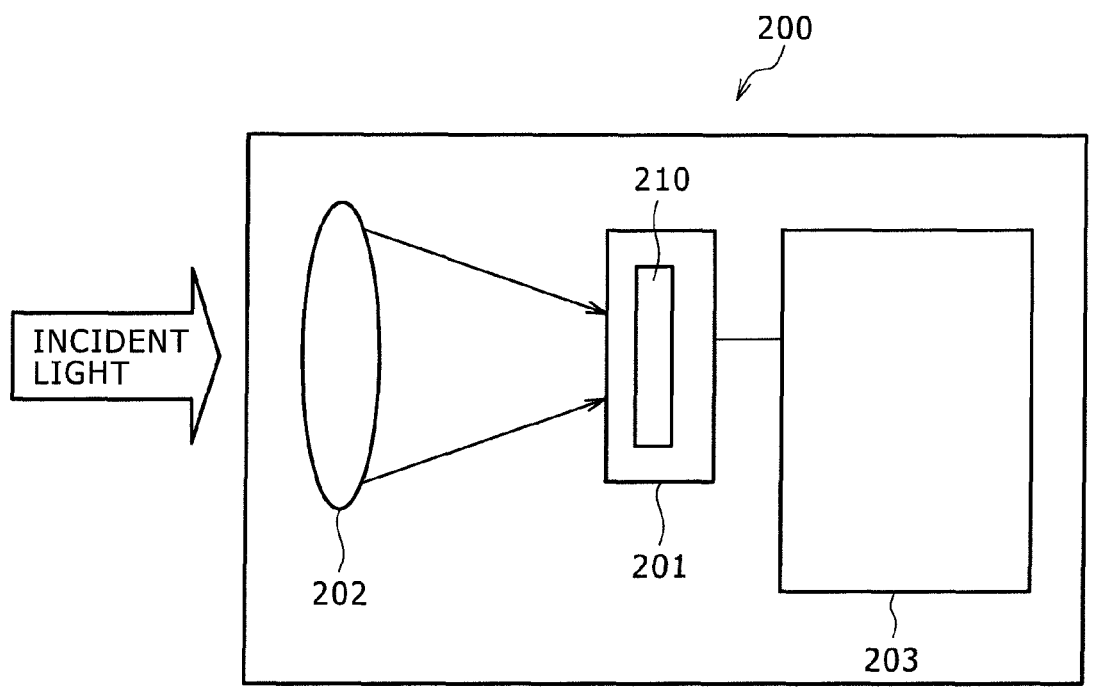
FIG. 8 is a block diagram showing one example of the image acquisition instruments to which is applied the solid-state imaging device according to the present embodiment.
Figure 9:
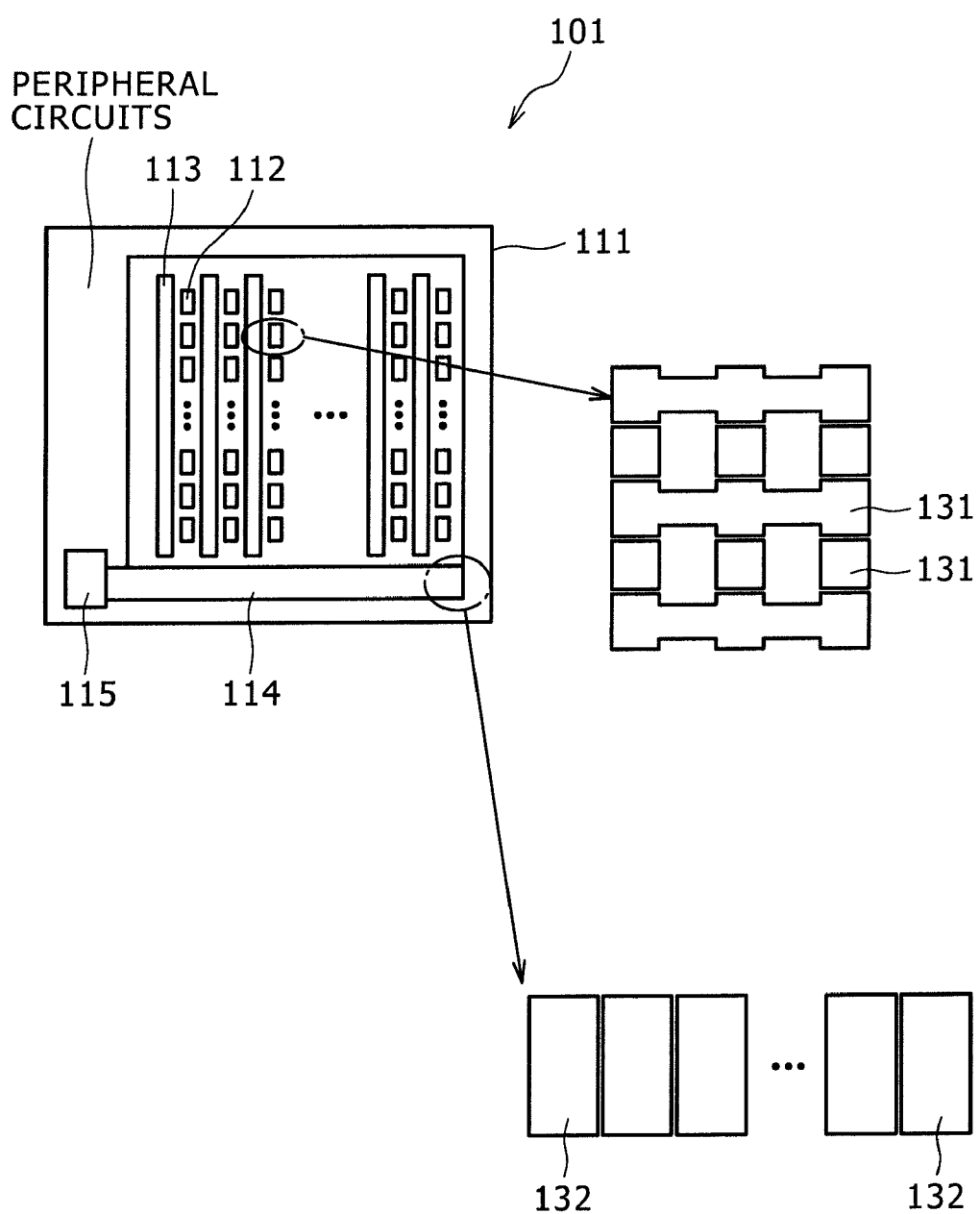
FIG. 9 is a plan view showing an existing solid-state imaging device.
Figure 10A:
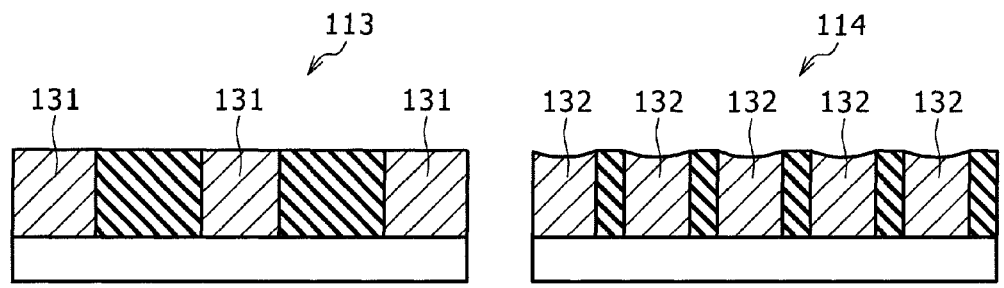
FIGS. 10A to 10C are schematic sectional views illustrating problems involved in existing technologies.
Figure 10B:
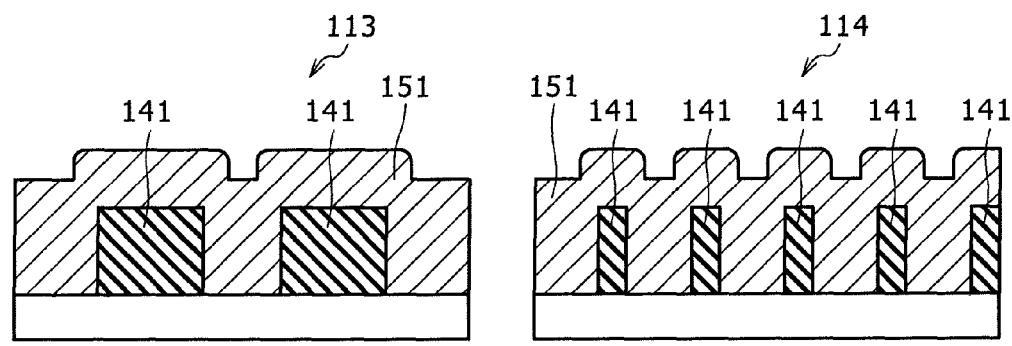
Figure 10C:
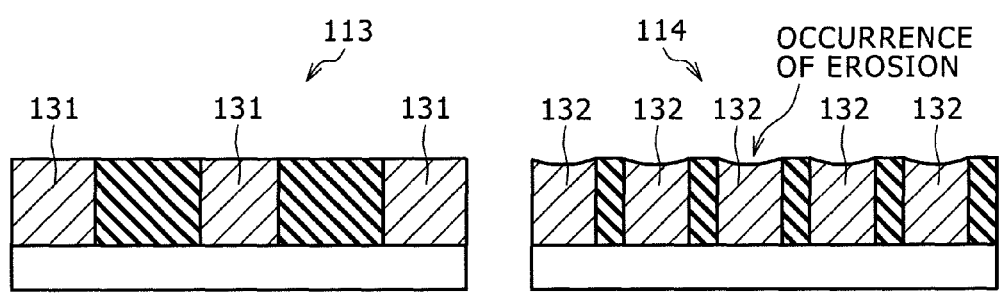

The solid-state imaging device according to the present embodiment may be applied to image acquisition instruments, an example of which is illustrated by a block diagram in FIG. 8. The illustrated image acquisition instrument is provided with the solid-state imaging device according to the present embodiment.

As shown in FIG. 8, the image acquisition instrument 200 is provided with the solid-state imaging device 210 in the image acquisition unit 201. It is also provided with the light condenser 202 which forms an image on the image acquisition unit 201. The image acquisition unit 201 is connected to the signal processing unit 203 containing drive circuits and signal processing circuits to convert signals (resulting from photoelectric conversion by the solid-state imaging device 210) into images. The image signals produced by the signal processing unit 203 may be stores in the image memory unit (not shown). The image acquisition instrument 200 may be equipped with the solid-state imaging device 1 (described in the foregoing embodiment) as the solid-state imaging device 210.

The image acquisition instrument 200 mentioned above offers the advantage of lower power consumption than existing ones because it is provided with the solid-state imaging device 1 of the present embodiment which operates with a less amount of driving power for charge transfer.

The image acquisition instrument 200 mentioned above may be in the form of one-chip or module in which the image acquisition unit and the signal processing unit or optical system is packaged. Incidentally, the image acquisition instrument 200 denotes a camera or a portable terminal with imaging capability. Also, the term "imaging" means not only image acquisition by a camera but also fingerprint detection in a broad sense.

The present application contains subject matter related to that disclosed in Japanese Priority Patent Application JP 2009-104676 filed in the Japan Patent Office on Apr. 23, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a semiconductor substrate having photoelectric conversion elements formed in a matrix pattern,
a plurality of vertical transfer elements, each of which reads signal charges from said photoelectric conversion elements arranged in a column direction and transfers said signal charges in a vertical direction,
and a horizontal transfer element which transfers in a horizontal direction the signal charges sent from each of said vertical transfer elements,
wherein said horizontal transfer element is comprised of:
a charge transfer channel having a first charge transfer channel portion and a second charge transfer channel portion arranged alternately, said second charge transfer channel portion having a lower impurity concentration than said first charge transfer channel portion;
a first transfer electrode formed over said first charge transfer channel portion, with a gate insulating film interposed in between;
a second transfer electrode formed over said second charge transfer channel portion, with a gate insulating film interposed in between;
and an interelectrode insulating film which is formed above a boundary between said first charge transfer channel portion and said second charge transfer channel portion and between said first transfer electrode and said second transfer electrode;

wherein said first transfer electrode and said second transfer electrode are connected to a same driving potential and the first charge transfer electrode and the second charge transfer electrode are each more narrow than the corresponding first charge transfer channel portion and second charge transfer channel portion.

2. The solid-state imaging device as defined in claim 1, wherein said first transfer electrode and said second transfer electrode are connected to each other by a wiring.

3. The solid-state imaging device as defined in claim 1, wherein said charge transfer channel is composed of said first charge transfer channel, said second charge transfer channel, and a third charge transfer channel having a lower impurity concentration than said second charge transfer channel;

said first charge transfer channel, said second charge transfer channel, and said third charge transfer channel are sequentially and repeatedly arranged; and a third transfer electrode is formed on said third charge transfer channel, with a gate insulating film interposed between them;

with said first transfer electrode, said second transfer electrode, and said third transfer electrode being at the same potential.

4. The solid-state imaging device as defined in claim 3, wherein said first transfer electrode, said second transfer electrodes, and said third transfer electrode are connected to one another by a wiring.

5. A solid-state imaging device comprising:

a semiconductor substrate having photoelectric conversion means formed in a matrix pattern, a plurality of vertical transfer means, each of which reads signal charges from said photoelectric conversion means arranged in a column direction and transfers said signal charges in a vertical direction, and a horizontal transfer means which transfers in a horizontal direction the signal charges sent from each of said vertical transfer means, wherein said horizontal transfer means comprises:

a charge transfer channel having a first charge transfer channel portion and a second charge transfer channel portion arranged alternately, said second charge transfer channel portion having a lower impurity concentration than said first charge transfer channel portion;

a first transfer electrode formed over said first charge transfer channel portion, with a gate insulating film in between;

a second transfer electrode formed over said second charge transfer channel portion, with a gate insulating film in between; and an interelectrode insulating film which is formed above a boundary between said first charge transfer channel portion and said second charge transfer channel portion and between said first transfer electrode and said second transfer electrode;

wherein said first transfer electrode and said second transfer electrode are connected to a same potential and the first charge transfer electrode and the second charge transfer electrode are each more narrow than the corresponding first charge transfer channel portion and second charge transfer channel portion.

6. The solid-state imaging device as defined in claim 1, wherein said first transfer electrode and said second transfer electrode are formed from a metal, alloy or metal compound.

7. The solid-state imaging device as defined in claim 5, wherein said first transfer electrode and said second transfer electrode are formed from a metal, alloy or metal compound.

* * * * *